(12) United States Patent
Tani

(10) Patent No.: US 10,211,135 B2
(45) Date of Patent: Feb. 19, 2019

(54) SEMICONDUCTOR DEVICE

(71) Applicant: JTEKT CORPORATION, Osaka-shi, Osaka (JP)

(72) Inventor: Naoki Tani, Kashiwara (JP)

(73) Assignee: JTEKT CORPORATION, Osaka (JP)

(*) Notice: Subject to any disclaimer, the term of this patent is extended or adjusted under 35 U.S.C. 154(b) by 0 days.

(21) Appl. No.: 15/623,943

(22) Filed: Jun. 15, 2017

(65) Prior Publication Data

US 2017/0372990 A1 Dec. 28, 2017

(30) Foreign Application Priority Data

Jun. 22, 2016 (JP) .................... 2016-123869

(51) Int. Cl.
*H01L 23/498* (2006.01)
*H01L 23/522* (2006.01)
*H01L 23/12* (2006.01)
*H05K 1/02* (2006.01)
*H01L 23/00* (2006.01)

(52) U.S. Cl.
CPC ........ *H01L 23/49816* (2013.01); *H01L 23/12* (2013.01); *H01L 23/49827* (2013.01); *H01L 23/49838* (2013.01); *H01L 23/522* (2013.01); *H05K 1/0271* (2013.01); *H01L 23/562* (2013.01); *H01L 2224/16225* (2013.01); *H01L 2224/73204* (2013.01); *H05K 2201/068* (2013.01); *H05K 2201/09136* (2013.01);

(Continued)

(58) Field of Classification Search
CPC ............. H01L 23/49816; H01L 23/562; H01L 23/522; H01L 23/49827
See application file for complete search history.

(56) References Cited

U.S. PATENT DOCUMENTS 5,852,326 A * 12/1998 Khandros ........... H01L 21/6836
257/690
2002/0041489 A1 4/2002 Fritz
(Continued)

FOREIGN PATENT DOCUMENTS

GB 2-062963 * 5/1981
JP H08-97319 A 4/1996
(Continued)

OTHER PUBLICATIONS

Nov. 15, 2017 Extended European Search Report issued in European Patent Application No. 17177033.2.

*Primary Examiner* — A. Sefer
(74) *Attorney, Agent, or Firm* — Oliff PLC

(57) ABSTRACT

A semiconductor device includes a semiconductor element, a circuit board, metal wires, and an expanding member. The circuit board has an upper surface and a lower surface opposite the upper surface. The metal wires are formed on at least one of the upper surface and the lower surface. At least two connection terminals are formed in a terminal formation surface of the semiconductor element which is disposed so as to face the upper surface of the circuit board. The expanding member is fixed to the terminal formation surface of the semiconductor element, has a larger coefficient of linear thermal expansion than the semiconductor element, and has a size larger than the interval between adjacent two of the at least two connection terminals.

9 Claims, 12 Drawing Sheets

(52) U.S. Cl.
CPC .............. *H05K 2201/10568* (2013.01); *H05K 2201/2018* (2013.01)

(56) References Cited

U.S. PATENT DOCUMENTS

| | | | | |
|---|---|---|---|---|
| 2003/0047801 A1* | 3/2003 | Azuma | ............... | H01L 21/4853 257/700 |
| 2003/0183407 A1* | 10/2003 | Ma | ..................... | B81B 7/0006 174/539 |
| 2006/0038235 A1 | 2/2006 | Ogata | | |
| 2008/0308314 A1 | 12/2008 | Sasaki | | |

FOREIGN PATENT DOCUMENTS

| | | |
|---|---|---|
| JP | 2000-022034 A | 1/2000 |
| JP | 2014-107490 A | 6/2014 |

\* cited by examiner

SEMICONDUCTOR DEVICE

INCORPORATION BY REFERENCE

The disclosure of Japanese Patent Application No. 2016-123869 filed on Jun. 22, 2016 including the specification, drawings and abstract, is incorporated herein by reference in its entirety.

BACKGROUND OF THE INVENTION

1. Field of the Invention

The present invention relates to semiconductor devices having a semiconductor element mounted on a circuit board.

2. Description of the Related Art

The number of connection terminals included in semiconductor elements has been increasing with improvement in capability of semiconductor elements. At the same time, reduction in size of semiconductor elements has also been desired. In order to efficiently arrange a plurality of connection terminals in a small region, a flip-chip structure is used for semiconductor elements. For example, the flip-chip structure has a structure in which a plurality of connection terminals are arranged in an array on the bottom surface of a semiconductor element.

However, in the case where a semiconductor element having a flip-chip structure is mounted on a circuit board, cracks may form in solder connecting the circuit board and the semiconductor element.

The circuit board and the semiconductor element expand with heat generated by the semiconductor element and a heat source disposed around the semiconductor element. Since the circuit board has a larger coefficient of linear thermal expansion than the semiconductor element, the circuit board expands to a larger extent than the semiconductor element. This difference in expansion between the circuit board and the semiconductor element causes warping of the semiconductor element. Such warping of the semiconductor element causes cracks in the solder electrically connecting the connection terminals of the semiconductor element to wires formed on the circuit board. Since such cracks causes failure of a semiconductor device having such a semiconductor element, measures should be taken to prevent formation of cracks.

Japanese Patent Application Publication No. 2000-22034 (JP 2000-22034 A) discloses a connection structure that connects a Large-Scale Integration (LSI) having a flip-chip structure and a circuit board having the LSI mounted thereon. In JP 2000-22034 A, connection terminals of the LSI are arranged in an array in the central region (electrical connection terminal region) of the bottom surface of the LSI. A region (mechanical connection reinforcing terminal region) that reinforces mechanical connection between the LSI and the circuit board is formed around the electrical connection terminal region. The circuit board and the mechanical connection reinforcing terminal region of the LSI are reflowed with solder balls, whereby the solder balls mechanically connecting the circuit board and the mechanical connection reinforcing terminal region of the LSI are arranged in an array. This reinforces connection between the LSI and the circuit board and thus restrains warping of the LSI. Reliability of electrical connection between the semiconductor element and the wires on the circuit board can thus be improved.

SUMMARY OF THE INVENTION

It is one object of the present invention to provide a semiconductor device capable of preventing cracks from forming by solder that electrically connects connection terminals of a semiconductor element and wires on a circuit board.

According to an aspect of the present invention, a semiconductor device includes: a circuit board having a first surface and a second surface opposite the first surface; at least two metal wires formed on at least one of the first and second surfaces; a semiconductor element having at least two connection terminals formed in a terminal formation surface disposed so as to face the first surface; solder electrically connecting the at least two connection terminals to the at least two metal wires; and an expanding member fixed to the terminal formation surface of the semiconductor element, having a larger coefficient of linear thermal expansion than the semiconductor element, and having a size larger than an interval between adjacent two of the at least two connection terminals.

In the semiconductor device of the above aspect, the expanding member has a larger coefficient of linear thermal expansion than the semiconductor element and is fixed to the terminal formation surface of the semiconductor element. The size of the expanding member is larger than the interval between adjacent two of the connecting terminals. Since a stress associated with expansion of the expanding member is transmitted to a portion of the semiconductor element which is located between adjacent two of the connecting terminals, a shear stress that is applied to a connection surface between the connection terminal and the solder can be reduced. The semiconductor device of this aspect can thus prevent cracks from forming in the connection surface between the connection terminal and the solder.

BRIEF DESCRIPTION OF THE DRAWINGS

The foregoing and further features and advantages of the invention will become apparent from the following description of example embodiments with reference to the accompanying drawings, wherein like numerals are used to represent like elements and wherein.

DETAILED DESCRIPTION OF EMBODIMENTS

Figure 1:
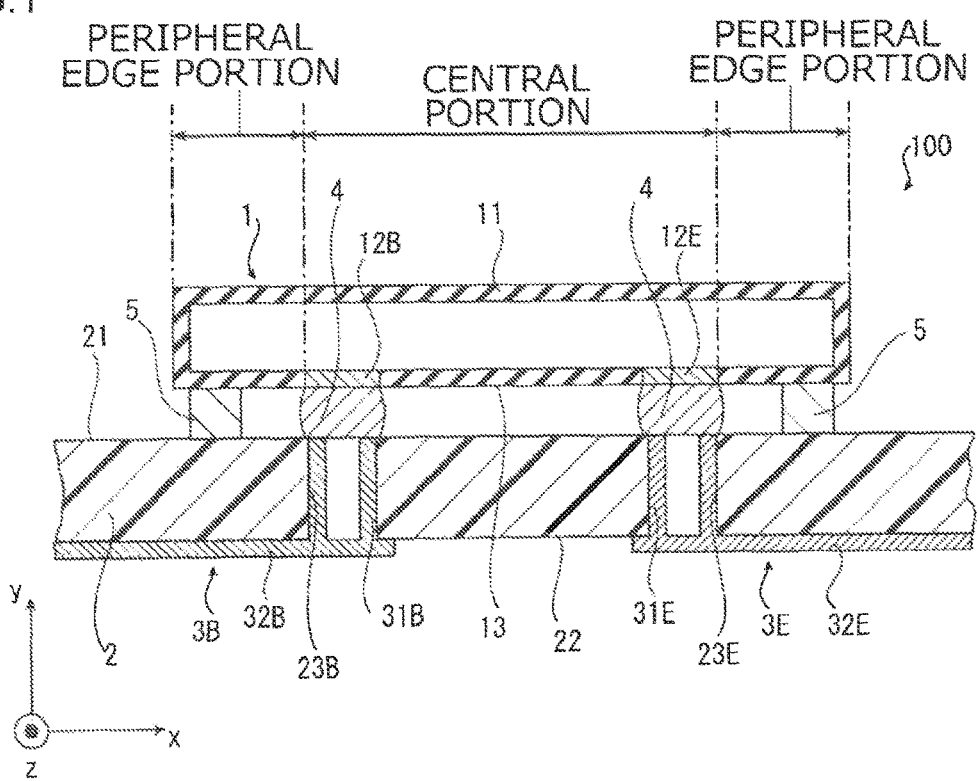
FIG. 1 is a side sectional view showing the configuration of a semiconductor device according to a first embodiment of the present invention.

Embodiments of the present invention will be described in detail below with reference to the accompanying drawings. In the figures, the same or corresponding portions are denoted with the same reference characters and description thereof will not be repeated.

Figure 2:
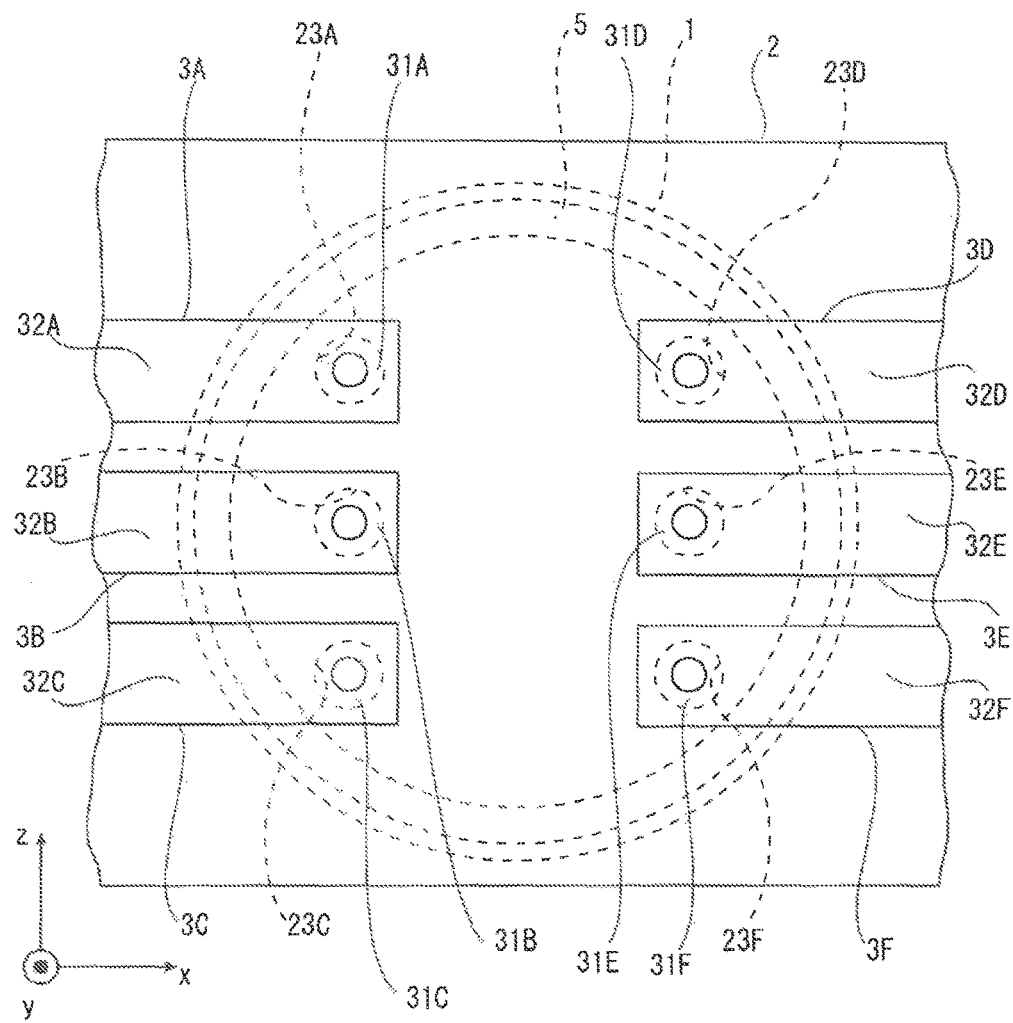
FIG. 2 is a bottom view of a circuit board shown in FIG. 1.
Figure 3:
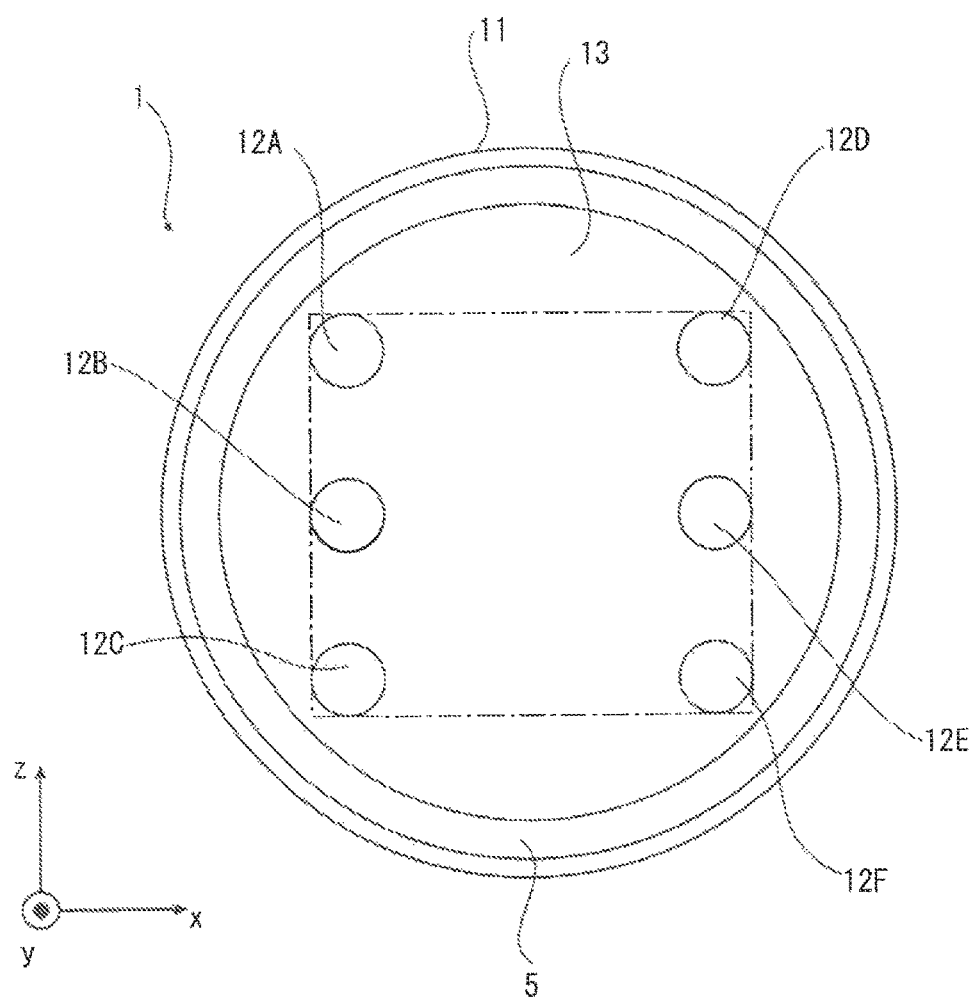
FIG. 3 is a bottom view of a semiconductor element shown in FIG. 1.

FIG. 1 is a side sectional view showing the configuration of a semiconductor device 100 according to a first embodiment of the present invention. FIG. 2 is a bottom view of a circuit board 2 shown in FIG. 1. FIG. 3 is a bottom view of a semiconductor element 1 shown in FIG. 1.

In the following description, the lateral direction in FIG. 1 is defined as the x-axis, the vertical direction in FIG. 1 is defined as the y-axis, and the direction perpendicular to the plane of the paper of FIG. 1 and away from the viewer is defined as the z-axis. For convenience of explanation, the y-axis direction is sometimes referred to as the vertical direction, the direction in which the circuit board 2 is located as viewed from the semiconductor element 1 is sometimes referred to as the downward direction.

As shown in FIGS. 1 and 2, the semiconductor device 100 includes the semiconductor element 1, the circuit board 2, metal wires 3A to 3F, solder bumps 4, and an expanding member 5. Hereinafter, the metal wires 3A to 3F are sometimes collectively referred to as the metal wires 3.

For example, the semiconductor device 100 is a control circuit for an electric power steering motor for automobiles, and is used to generate an alternating current for driving this motor. The semiconductor element 1 generates control signals for switching elements, not shown, and supplies the control signals to the switching elements.

For example, the semiconductor element 1 is a semiconductor chip including a circuit unit that is formed by transistors, diodes, etc. The semiconductor element 1 is located above the circuit board 2. As shown in FIGS. 1 and 3, the semiconductor element 1 includes a housing 11 and connection terminals 12A to 12F. The circuit unit that is formed by transistors, diodes, etc. is not shown in the semiconductor element 1 of FIG. 1.

The semiconductor element 1 expands with heat generated by the semiconductor element 1 itself and heat generated by other heat source such as the switching elements. The coefficient of linear thermal expansion of the semiconductor element 1 is determined by the material used for the housing 11, the material used for a substrate of the circuit unit, etc. Specifically, the coefficient of linear thermal expansion of the semiconductor element 1 is 2 to $6 \times 10^{-6}$(1/K).

The connection terminals 12A to 12F are input/output terminals in the semiconductor element 1 and are connected to the circuit unit. Hereinafter, the connection terminals 12A to 12F are sometimes collectively referred to as the connection terminals 12. The connection terminals 12 are arranged in an array in a terminal formation surface 13 of the semiconductor element 1 which faces an upper surface 21 of the circuit board 2. Specifically, the connection terminals 12 are arranged in an array of two in the x-axis direction and three in the z-axis direction in the terminal formation surface 13. The terminal formation surface 13 corresponds to a bottom surface of the housing 11. The semiconductor element 1 is a lateral semiconductor element having the connection terminals 12 formed in one of its two surfaces facing each other, and has a flip-chip structure.

As shown in FIGS. 1 and 2, the circuit board 2 is a flat plate-like member. The circuit board 2 is made of a material having a larger coefficient of linear thermal expansion than the semiconductor element 1. Specifically, the coefficient of linear thermal expansion of the circuit board 2 is 10 to $20 \times 10^{-6}$(1/K).

Through holes 23A to 23F extend through the circuit board 2 in the vertical direction. The through holes 23A to 23F are formed in an array of two in the x-axis direction and three in the z-axis direction. The through holes 23A to 23F are formed so as to be aligned with the connection terminals 12A to 12F of the semiconductor element 1 when the semiconductor device 100 is viewed downward from above.

Each of the metal wires 3A to 3F is formed on a lower surface 22 of the circuit board 2 and an inner peripheral surface of a corresponding one of the through holes 23A to 23F extending through the circuit board 2 in the vertical direction. Specifically, the metal wire 3A includes an interlayer connection portion 31A formed on the inner peripheral surface of the through hole 23A by metal plating, and a pattern portion 32A formed on the lower surface 22 of the circuit board 2.

Each of the metal wires 3B to 3F has a configuration similar to that of the metal wire 3A. That is, the metal wire 3B includes an interlayer connection portion 31B and a pattern portion 32B. The metal wire 3C includes an interlayer connection portion 31C and a pattern portion 32C. The metal wire 3D includes an interlayer connection portion 31D and a pattern portion 32D. The metal wire 3E includes an interlayer connection portion 31E and a pattern portion 32E. The metal wire 3F includes an interlayer connection portion 31F and a pattern portion 32F.

For example, the material of the metal wires 3 is copper or an alloy mainly containing copper. Specifically, a metal buying a coefficient of linear thermal expansion of 14 to $23 \times 10^{-6}$(1/K) is used as the metal wires 3. That is the circuit board 2 is designed to have about the same coefficient of linear thermal expansion as the metal wires 3.

The solder bumps 4 electrically connect the connection terminals 12A to 12F of the semiconductor element 1 to the metal wires 3A to 3F. The solder bumps 4 have a larger coefficient of linear thermal expansion than the semiconductor element 1. Specifically, the coefficient of linear thermal expansion of the solder bumps 4 is 14 to $30 \times 10^{-6}$ (1/K). The connection terminal 12A is soldered to the interlayer connection portion 31A of the metal wire 3A with the solder bump 4, whereby the connection terminal 12A is electrically connected to the metal wire 3A. Similarly, the connection terminal 12B is electrically connected to the metal wire 3B, the connection terminal 12C is electrically connected to the metal wire 3C, the connection terminal 12D is electrically connected to the metal wire 3D, the connection terminal 12E is electrically connected to the metal wire 3E, and the connection terminal 12F is electrically connected to the metal wire 3F.

As shown in FIGS. 1 and 3, the expanding member 5 has an annular shape and is placed along the outer periphery of the terminal formation surface 13 of the semiconductor element 1. That is, the expanding member 5 is placed so as to surround the connection terminals 12. An upper surface of the expanding member 5 is fixed to the terminal formation surface 13 of the semiconductor element 1. A lower surface of the expanding member 5 is in contact with, but is not fixed to, the upper surface 21 of circuit board 2.

The expanding member 5 is made of a material having a larger coefficient of linear thermal expansion than the semiconductor element 1. For example, the expanding member 5 is made of solder, a copper plate bonded to semiconductor, etc. The coefficient of linear thermal expansion of the expanding member 5 is preferably 10 to $33 \times 10^{-6}$(1/K), and more preferably 14 to $30 \times 10$ (1/K).

As described above, the expanding member 5 is fixed to the terminal formation surface 13 of the semiconductor element 1 and is disposed in an annular shape along the outer periphery of the terminal formation surface 13. Disposing the expanding member 5 can prevent cracks from forming in the semiconductor device 100 due to heat generated by the semiconductor element 1 and a heat source placed near the semiconductor element 1. This will be described in detail below.

As used herein, cracks mean cracks in the connection surface between the connection terminal 12 and the solder bump 4. Examples of the heat source include switching elements that operate according to control signals generated by the semiconductor element 1 and a motor disposed near the semiconductor device 100.

Figure 4:
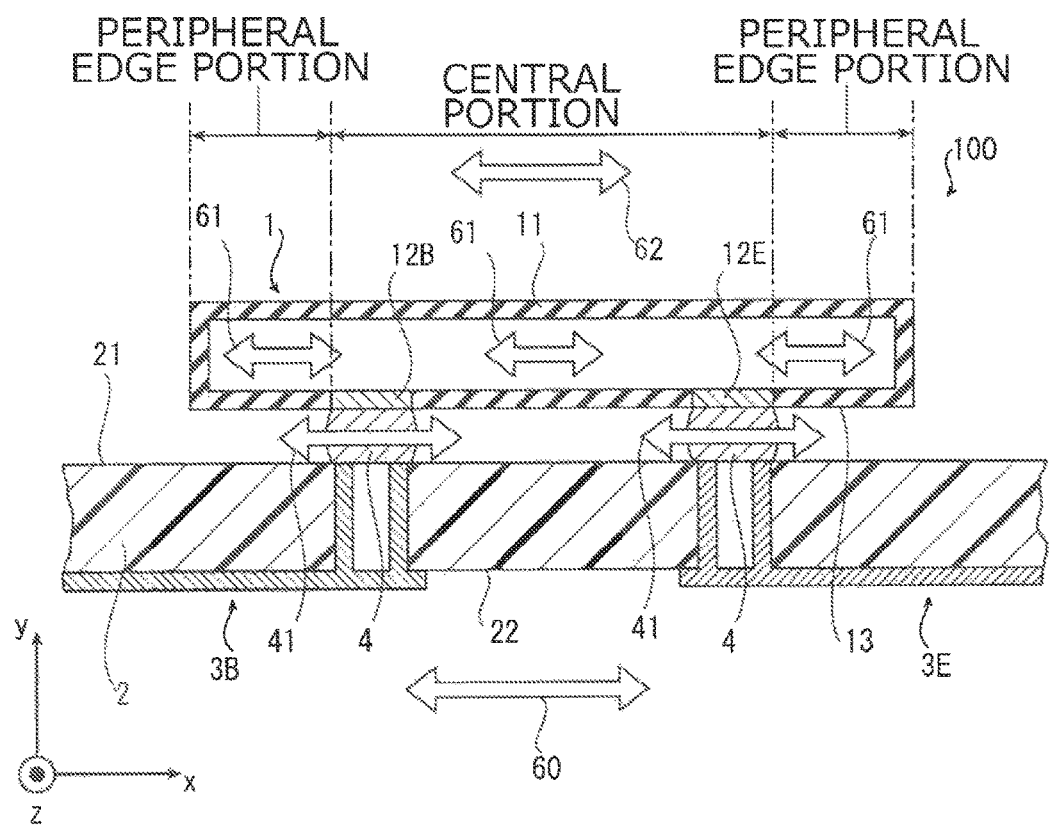
FIG. 4 is a view illustrating stresses that are applied to the semiconductor device shown in FIG. 1.

First, causes of cracks will be described with reference to FIG. 4. FIG. 4 is a view illustrating stresses that are applied to the semiconductor device 100. The expanding member 5 is not shown in FIG. 4. The reference characters of the through holes, the interlayer connection portions, and the pattern portions are not shown in FIG. 4.

The semiconductor element 1, the circuit board 2, the metal wires 3, and the solder bumps 4 expand with heat generated by the semiconductor element 1 and the heat source. That is, the semiconductor element 1, the circuit board 2, the metal wires 3, and the solder bumps 4 are subjected to stresses in the x-axis direction, the y-axis direction, and the z-axis direction. Of the stresses in the three axis directions, the stresses in the x-axis direction and the z-axis direction (stresses in directions parallel to the xz plane) cause cracks.

As described above, the circuit board 2 and the metal wires 3 have about the same coefficient of linear thermal expansion. Expansion of the circuit board 2 in the directions parallel to the xz plane is therefore about the same as that of the metal wires 3 in the directions parallel to the xz plane, and the circuit board 2 and the metal wires 3 are subjected to a stress 60. Since the amount of expansion does not vary so much between the circuit board 2 and the metal wires 3, warping of the circuit board 2 is restrained. The circuit board 2 and the metal wires 3 can thus be regarded as a single member in terms of thermal expansion.

As described above, the semiconductor element 1 has a smaller coefficient of linear thermal expansion than the circuit board 2 and the metal wires 3. The coefficient of linear thermal expansion of the semiconductor element 1 is about one third of the coefficient of linear thermal expansion of each of the circuit board 2 and the metal wires 3. Expansion of the semiconductor element 1 in the directions parallel to the xz plane is therefore smaller than that of the circuit board 2 and the metal wires 3 in the directions parallel to the xz plane. A stress 61 that is applied according to the expansion of the semiconductor element 1 in the directions parallel to the xz plane is smaller than the stress 60 that is applied according to the expansion of the circuit board 2 and the metal wires 3 in the directions parallel to the xz plane.

As a result, the difference between the stress 61 that is applied to the semiconductor element 1 and the stress 60 that is applied to the circuit board 2 and the metal wires 3 acts as a shear stress in the connection surface between the connection terminal 12 and the solder bump 4. While heat is being generated by the semiconductor element 1 and the heat source, the connection surface between the connection terminal 12 and the solder bump 4 is continuously subjected to the shear stress. This shear stress is generated by the difference in coefficient of linear thermal expansion between the semiconductor element 1 and each of the circuit board 2 and the metal wires 3, and causes strain in the connection surface between the connection terminal 12 and the solder bump 4. This shear stress thus causes cracks in the connection surface between the connection terminal 12 and the solder bump 4.

The difference in coefficient of linear thermal expansion between the semiconductor element 1 and the solder bumps 4 also causes cracks. As described above, since the solder bumps 4 have a larger coefficient of linear thermal expansion than the semiconductor element 1, expansion of the solder bumps 4 in the directions parallel to the xz plane is larger than that of the semiconductor element 1 in the directions parallel to the xz plane. Since a stress 41 that is applied to the solder bumps 4 in the directions parallel to the xz plane is larger than the stress 61 that is applied to the semiconductor element 1 in the directions parallel to the xz plane, the difference between the stress 41 and the stress 61 also acts as a shear stress in the connection surface between the connection terminal 12 and the solder bump 4. That is, the connection surface between the connection terminal 12 and the solder bump 4 is also subjected to the shear stress due to the difference in coefficient of linear thermal expansion between the semiconductor element 1 and the solder bump 4, and this shear stress also causes cracks.

Thermal warping of the semiconductor element 1 also causes cracks. As shown in FIG. 4, the stress 60 applied to the circuit board 2 is transmitted to a central portion of the semiconductor element 1 through the solder bumps 4 connected to the connection terminals 12B, 12E. The central portion refers to a portion of the semiconductor element 1 which is surrounded by the plurality of connection terminals 12 when the semiconductor element 1 is viewed downward from above. In FIG. 3, the region surrounded by an alternate long and short dash line corresponds to the central portion.

As a result, the central portion of the semiconductor element 1 is subjected to a combined stress 62 of the stress 61 and the stress 60 transmitted from the circuit board 2. The combined stress 62 is larger than the stress 61. The stress 60 applied to the circuit board 2 and the metal wires 3 is not transmitted to the peripheral edge portion of the semiconductor element 1, and the peripheral edge portion of the semiconductor element 1 is not affected by the stress 60. The peripheral edge portion refers to a portion of the semiconductor element 1 which is located outside the connection terminals 12. The outward direction is a direction in which the expanding member 5 is located with respect to the connection terminals 12. As a result, a local difference in stress is generated in the semiconductor element 1, whereby the semiconductor element 1 is warped convex downward. Such warping acts as a force pulling the semiconductor element 1 upward and therefore causes cracks.

Figure 5:
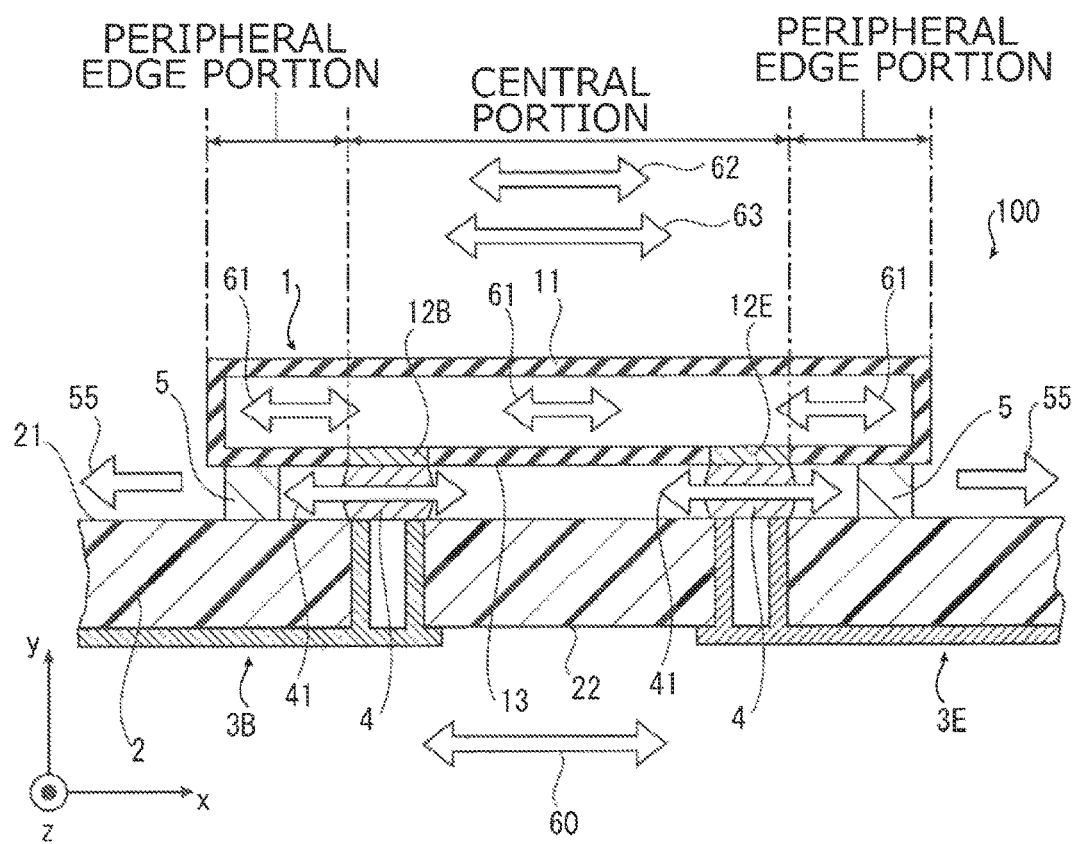
FIG. 5 is a view illustrating stresses that are applied to the semiconductor device shown in FIG. 1.
Figure 6:
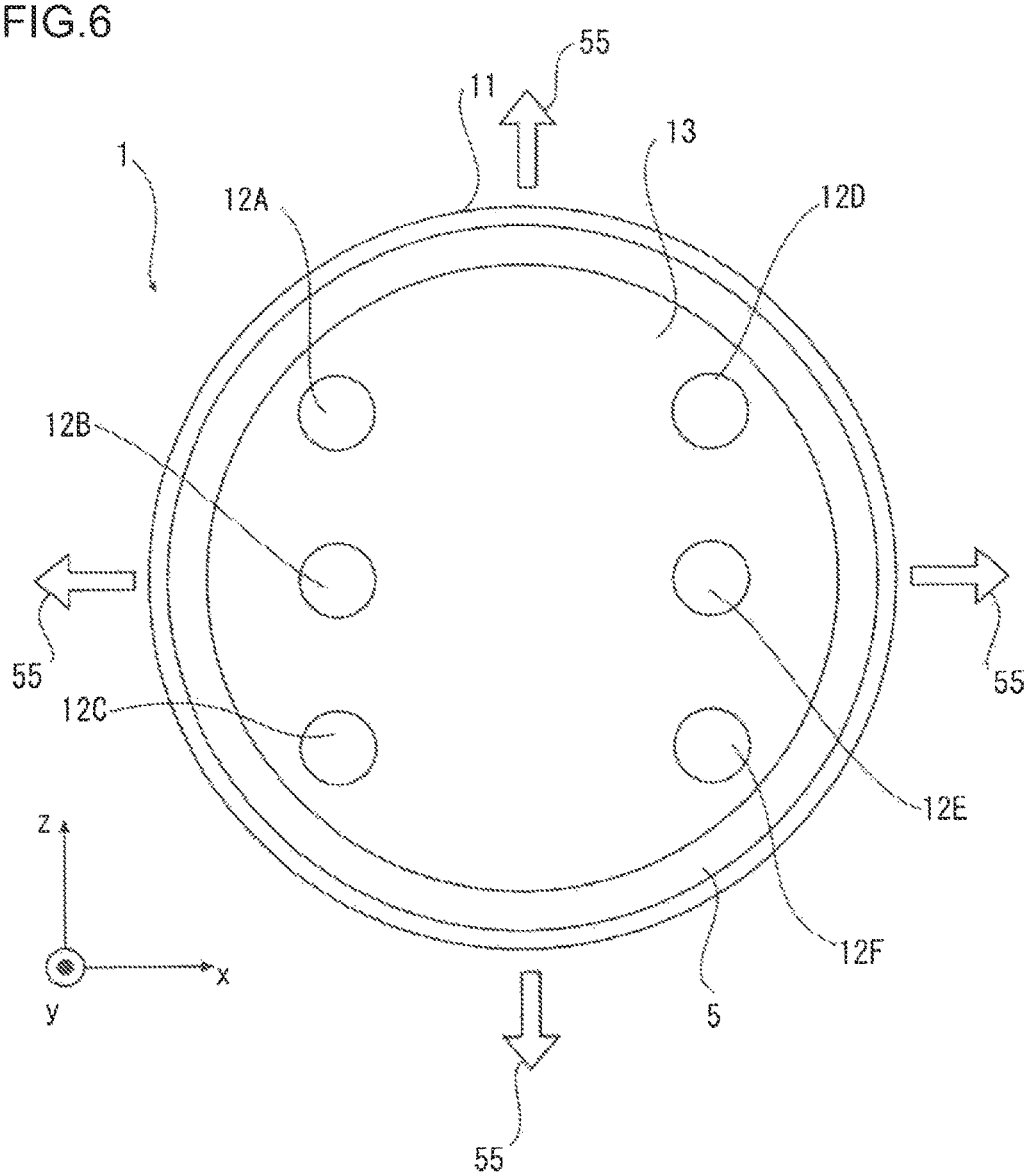
FIG. 6 is a view schematically illustrating a stress that is applied to an expanding member shown in FIG. 1.

FIGS. 5 and 6 are views illustrating a stress that is applied to the expanding member 5. FIG. 5 is a side sectional view of the semiconductor element 1, and FIG. 6 is a bottom view of the semiconductor element 1. The reference characters of the through holes, the interlayer connection portions, and the pattern portions are not shown in FIG. 5.

As shown in FIG. 5, the stress 61 is applied to the semiconductor element 1, the stress 60 is applied to the circuit board 2 and the metal wires 3, and the stress 41 is applied to the solder bumps 4. The combined stress 62 is applied to the central portion of the semiconductor element 1.

As shown in FIGS. 5 and 6, the expanding member 5 has an annular shape. Accordingly, when the expanding member 5 expands with heat, the expanding member 5 is subjected to a stress 55 applied in the directions parallel to the xz plane and outward. Since the expanding member 5 has a larger coefficient of linear thermal expansion than the semiconductor element 1, the stress 55 is larger than the stress 61 that is applied to the semiconductor element 1.

Since the expanding member 5 is not fixed to the upper surface 21 of the circuit board 2, the expanding member 5 moves relative to the circuit board 2 when expanding. The stress 55 is therefore not transmitted from the expanding member 5 to the circuit board 2. However, since the expanding member 5 is fixed to the terminal formation surface 13 of the semiconductor element 1, the peripheral edge portion of the semiconductor element 1 is subjected to the stress 55 applied to the expanding member 5. As described above, since the stress 55 is a force that is applied toward the outside of the expanding member 5, the stress 55 transmitted to the semiconductor element 1 acts as a force that extends the entire semiconductor element 1 in the directions parallel to the xz plane and outward from the center of the semiconductor element 1.

In the semiconductor element 1, the stress 61 and the stress 55 transmitted from the expanding member 5 are combined into a combined stress 63. The combined stress 63 is transmitted from the semiconductor element 1 to the connection surface between the connection terminal 12 and the solder bump 4. Since the combined stress 63 is larger than the stress 61, the difference between the stress 60 and the combined stress 63 is smaller than the difference between the stress 60 and the stress 51. The semiconductor device 100 can therefore reduce a shear stress that is applied due to the difference in coefficient of linear thermal expansion between the semiconductor element 1 and each of the circuit board 2 and the metal wires 3. Moreover, since the stress 55 is transmitted to the semiconductor element 1, the semiconductor device 100 can reduce a shear stress that is applied due to the difference in coefficient of linear thermal expansion between the semiconductor element 1 and the solder bumps 4. The semiconductor device 100 can thus restrain cracks from forming in the connection surface between the connection terminal 12 and the solder bump 4.

As described above, the stress 55 applied to the expanding member 5 is transmitted to the peripheral edge portion of the semiconductor element 1. The stress 55 acts as a force that extends the peripheral edge portion of the semiconductor element 1 outward. The expanding member 5 can reduce a local difference in stress in the semiconductor element 1. The semiconductor device 100 can restrain warping of the semiconductor element 1 and therefore can restrain cracks from forming in the connection surface between the connection terminal 12 and the solder bump 4.

As described above, the lower surface of the expanding member 5 is in contact with the upper surface 21 of the circuit board 2. The semiconductor device 100 can thus further restrain cracks from forming in the connection surface between the connection terminal 12 and the solder bump 4. This will be described in detail below.

In the semiconductor device 100, heat generated by the heat source, not shown, is conducted to the circuit board 2 and the metal wires 3. The heat thus conducted to the circuit board 2 and the metal wires 3 is conducted to the semiconductor element 1 through the solder bumps 4 or the expanding member 5. Since the semiconductor element 1 starts expanding later than the circuit board 2, the metal wires 3, and the solder bumps 4 do, the stress 60 and the stress 41 are applied before the stress 61. Accordingly, the shear stress applied to the connection surface between the connection terminal 12 and the solder bump 4 increases temporarily from the time the circuit board 2, the metal wires 3, and the solder bumps 4 start expanding until the semiconductor element 1 starts expanding.

Since the expanding member 5 is in contact with the upper surface 21 of the circuit board 2, heat conducting in the circuit board 2 is directly conducted from the circuit board 2 to the expanding member 5. The expanding member 5 can therefore be subjected to the stress 55 before the semiconductor element 1 is subjected to the stress 61. The stress 55 can thus be transmitted from the expanding member 5 to the semiconductor element 1 before the semiconductor element 1 starts expanding. This can restrain a temporary increase in shear stress from the time the circuit board 2 starts expanding until the semiconductor element 1 starts expanding.

Since the expanding member 5 is made of a metal such as solder, the expanding member 5 electromagnetically shields the space between the terminal formation surface 13 of the semiconductor element 1 and the upper surface 21 of the circuit board 2. This can prevent noise from being mixed with signals that are input to the semiconductor element 1 and signals that are output from the semiconductor element 1.

Figure 7:
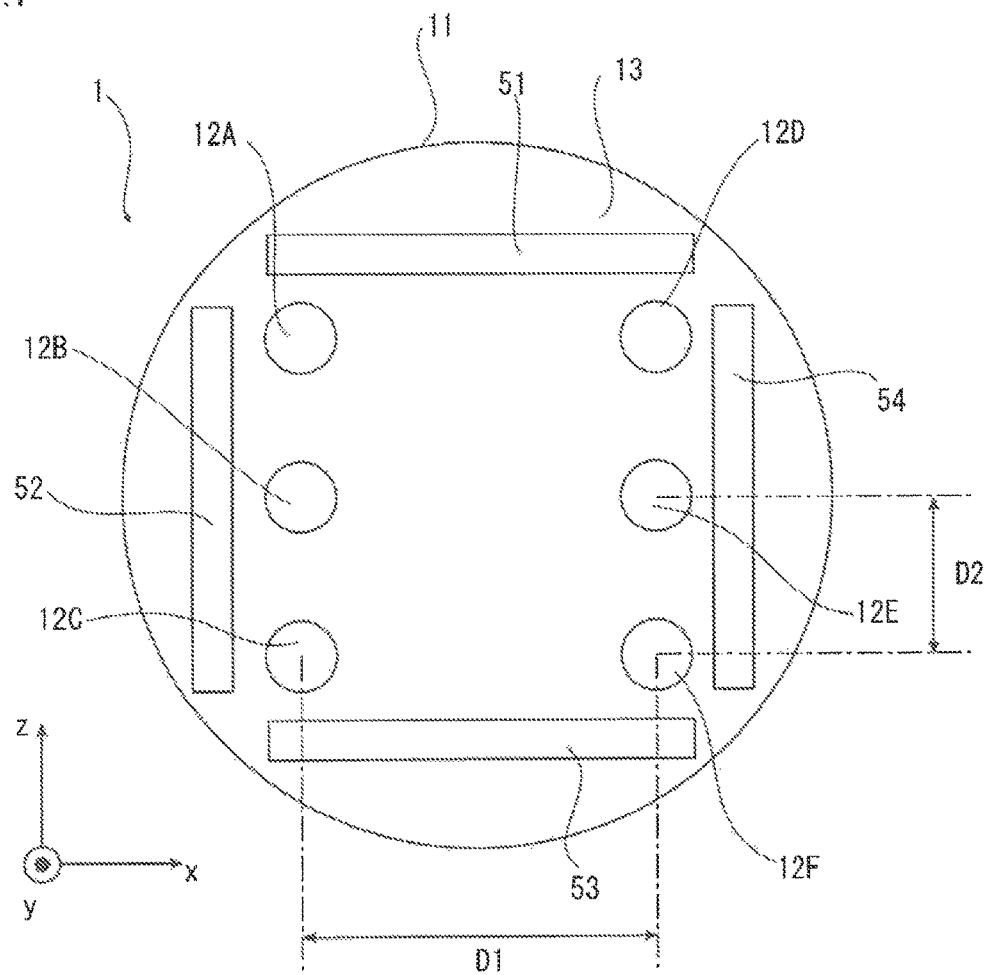
FIG. 7 is a view showing a modification of the expanding member shown in FIG. 1.

The first embodiment is described with respect to an example in which the expanding member 5 has an annular shape. However, the present invention is not limited to this. FIG. 7 is a bottom view of the semiconductor element 1, showing a modification of the expanding member 5 of the semiconductor device 100.

The semiconductor device 100 may include four expanding members 51 to 54 shown in FIG. 7, instead of the expanding member 5. Each of the expanding members 51 to 54 has a linear shape (rectangular shape). The expanding members 51 to 54 are fixed to the terminal formation surface 13 so as to surround the connection terminals 12. Like the expanding member 5 shown in FIG. 1, lower surfaces of the expanding members 51 to 54 are in contact with, but are not fixed to, the upper surface 21 of the circuit board 2.

The size of the expanding members 51 to 54 in the directions parallel to the xz plane will be described below. As shown in FIG. 7, D1 represents the interval between two connection terminals 12 adjacent to each other in the x-axis direction, and D2 represents the interval between two connection terminals 12 adjacent to each other in the z-axis direction. The interval between two connection terminals is defined by the distance from the center of one of the two connection terminals to the center of the other connection terminal.

Each of the expanding members 51 to 54 is disposed along a straight line connecting two connection terminals adjacent to each other, and the size of each of the expanding members 51 to 54 in the direction parallel to the xz plane is larger than the interval between the two connection terminals.

For example, the expanding member 51 is disposed along a straight line connecting the connection terminal 12A and the connection terminal 12D, and the size of the expanding member 51 in the x-axis direction is larger than the interval D1. The expanding member 52 is disposed along a straight line connecting the connection terminal 12A and the connection terminal 12B, and the size of the expanding member 52 in the z-axis direction is larger than the interval D2. Like the expanding member 5 shown in FIGS. 1 and 3, the expanding members 51 to 54 can thus apply a stress generated by expansion of the expanding members 51 to 54 to the central portion of the semiconductor element 1. Since the expanding members 51 to 54 can reduce a shear stress that is applied to the connection surface between the connection terminal 12 and the solder bump 4, cracks can be prevented from forming in the connection surface between the connection terminal 12 and the solder bump 4.

In FIG. 7, the expanding members 51 to 54 are disposed so as to be separated from each other. However, the expanding members 51 to 54 may be disposed so as to form a single quadrilateral frame with the ends of the expanding members 51 to 54 being in contact with each other.

The semiconductor device 100 need only include at least one of the expanding members 51 to 54 shown in FIG. 7. For example, the semiconductor device 100 may include only the expanding member 51 shown in FIG. 7, or may include only the expanding member 52. That is, the expanding member included in the semiconductor device 100 need only be an expanding member which is fixed to the terminal formation surface 13 and whose size in the direction of a straight line connecting adjacent two connection terminals formed in the terminal formation surface 13 is larger than the interval between the adjacent two connection terminals. The expanding member is disposed so as to extend from one of the adjacent two connection terminals toward the other.

Of stresses that are generated by the expanding member due to its expansion, the stress in the directions parallel to the xz plane is transmitted to the peripheral edge portion of the semiconductor element 1. The stress thus transmitted to the peripheral edge portion is transmitted to a portion of the semiconductor element 1 which is located between adjacent two connection terminals 12. As a result, the semiconductor device 100 can reduce a shear stress that is applied to the connection surface between the connection terminal 12 and the solder bump 4. The semiconductor element 1 can thus restrain formation of cracks.

Figure 8:
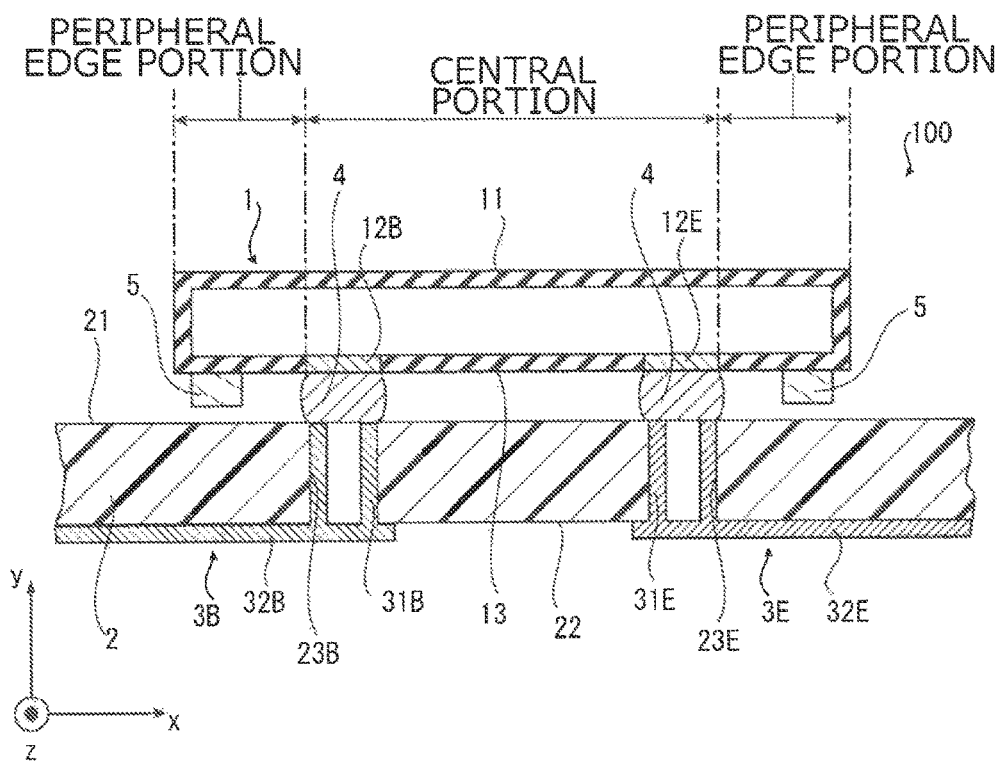
FIG. 8 is a side sectional view of a modification of the semiconductor device shown in FIG. 1.

The above embodiment is described with respect to an example in which the expanding member 51 is in contact with the upper surface 21 of the circuit board 2. However, the present invention is not limited to this. FIG. 8 is a side sectional view of another modification of the semiconductor device 100. As shown in FIG. 8, the lower surface of the expanding member 5 may not contact the upper surface 21 of the circuit board 2. In this case, since the metal wires 3 can be formed on the upper surface 21 of the circuit board 2, flexibility in design of the metal wires 3 that are formed on the circuit board 2 can be improved. That is, in the case where the semiconductor device 100 has the configuration shown in FIG. 8, the metal wires 3 need only be formed on at least one of the upper surface 21 and the lower surface 22 of the circuit board 2.

Figure 9:
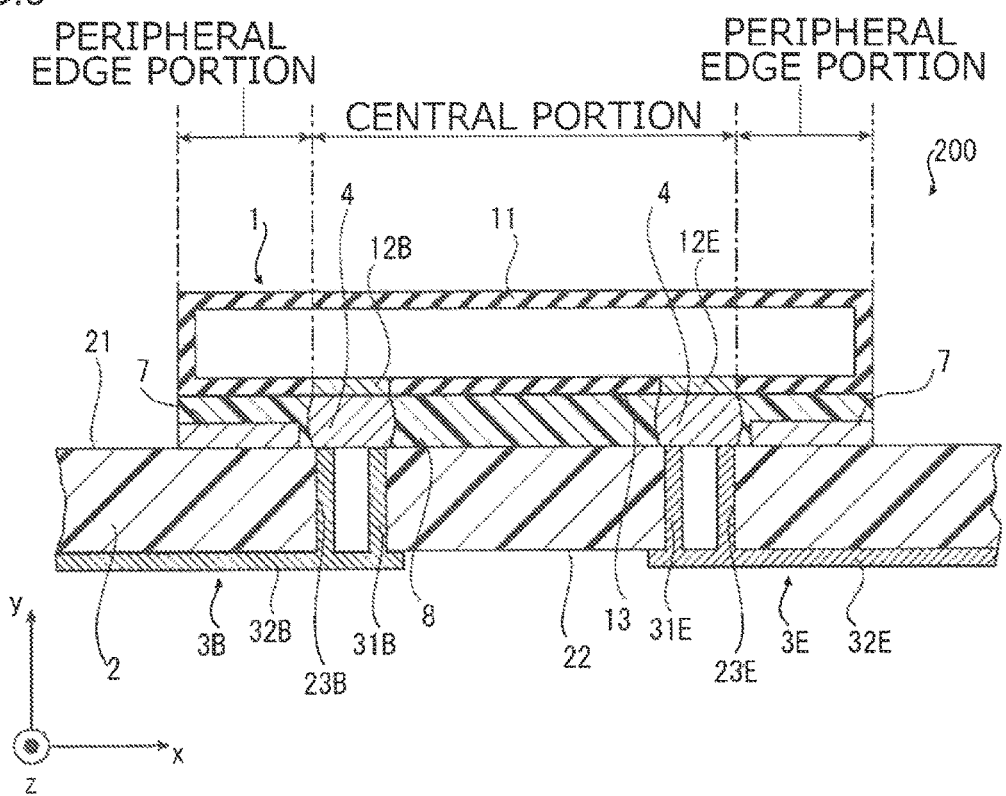
FIG. 9 is a side sectional view showing the configuration of a semiconductor device according to a second embodiment of the present invention.
Figure 10:
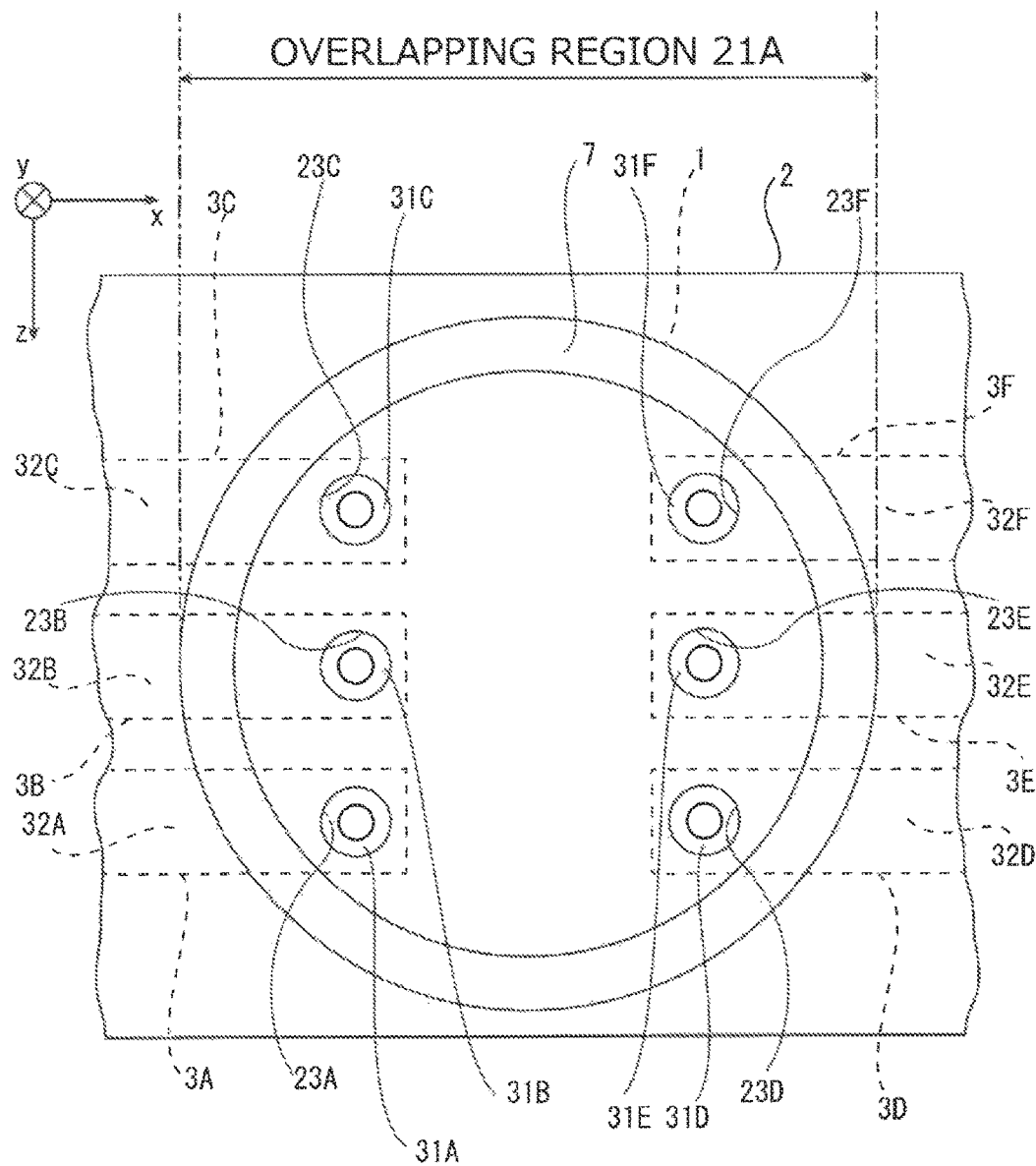
FIG. 10 is a plan view of a circuit board shown in FIG. 9.

FIG. 9 is a side sectional view showing the configuration of a semiconductor device 200 according to a second embodiment of the present invention. FIG. 10 is a plan view of the circuit board 2 shown in FIG. 9. The semiconductor device 200 shown in FIGS. 9 and 10 is different from the semiconductor device 100 according to the first embodiment in that the semiconductor device 200 includes an insertion member 7 and an expanding member 8, instead of the expanding member 5.

As shown in FIG. 10, the insertion member 7 is an annular member fixed to the upper surface 21 of the circuit board 2. The insertion member 7 is disposed along the outer periphery of an overlapping region 21A of the upper surface 21 of the circuit board 2. The overlapping region 21A is a region of the upper surface 21 of the circuit board 2 which overlaps the semiconductor element 1 when the semiconductor device 200 is viewed downward from above. Accordingly, the outer periphery of the insertion member 7 is in alignment with the outer periphery of the semiconductor element 1 when the semiconductor device 200 is viewed downward from above. The vertical size of the insertion member 7 is smaller than the distance between the terminal formation surface 13 of the semiconductor element 1 and the upper surface 21 of the circuit board 2. That is, an upper surface of the insertion member 7 does not contact the terminal formation surface 13 of the semiconductor element 1.

For example, the insertion member 7 is made of solder, a plating material, resin, etc. The insertion member 7 may be made of a plating material that is less adhesive to the expanding member 8, or may be copper etc. formed on the circuit board 2.

The expanding member 8 is a resin filling the space between the terminal formation surface 13 of the semiconductor element 1 and the upper surface 21 of the circuit board 2. The expanding member 8 is fixed to the terminal formation surface 13 of the semiconductor element 1. The expanding member 8 is fixed to a part of the overlapping region 21A of the upper surface 21 of the circuit board 2, namely a part where the insertion member 7 is not formed. That is, the insertion member 7 is disposed between the upper surface 21 of the circuit board 2 and a non-contact surface of a lower surface of the expanding member 8. The non-contact surface is a part of the lower surface of the expanding member 8 which does not contact the upper surface 21 of the circuit board 2. The expanding member 8 is fixed to the upper surface of the insertion member 7. The expanding member 8 has a larger coefficient of linear thermal expansion than the semiconductor element 1 and also has a larger coefficient of linear thermal expansion than the circuit board 2 and the metal wires 3. The coefficient of linear thermal expansion of the expanding member 8 is preferably 10 to $33 \times 10^{-6}$(1/K), and more preferably 14 to $30 \times 10^{-6}$(1/K).

Since the expanding member 8 is fixed to the entire terminal formation surface 13, the size of the expanding member 8 in the direction parallel to the xz plane is larger than the interval between adjacent two connection terminals 12.

As described above, the semiconductor device 200 has the expanding member 8 instead of the expanding member 5. Like the semiconductor device 100, the semiconductor device 200 can therefore restrain cracks from forming in the connection surface between the connection terminal 12 and the solder bump 4.

Figure 11:
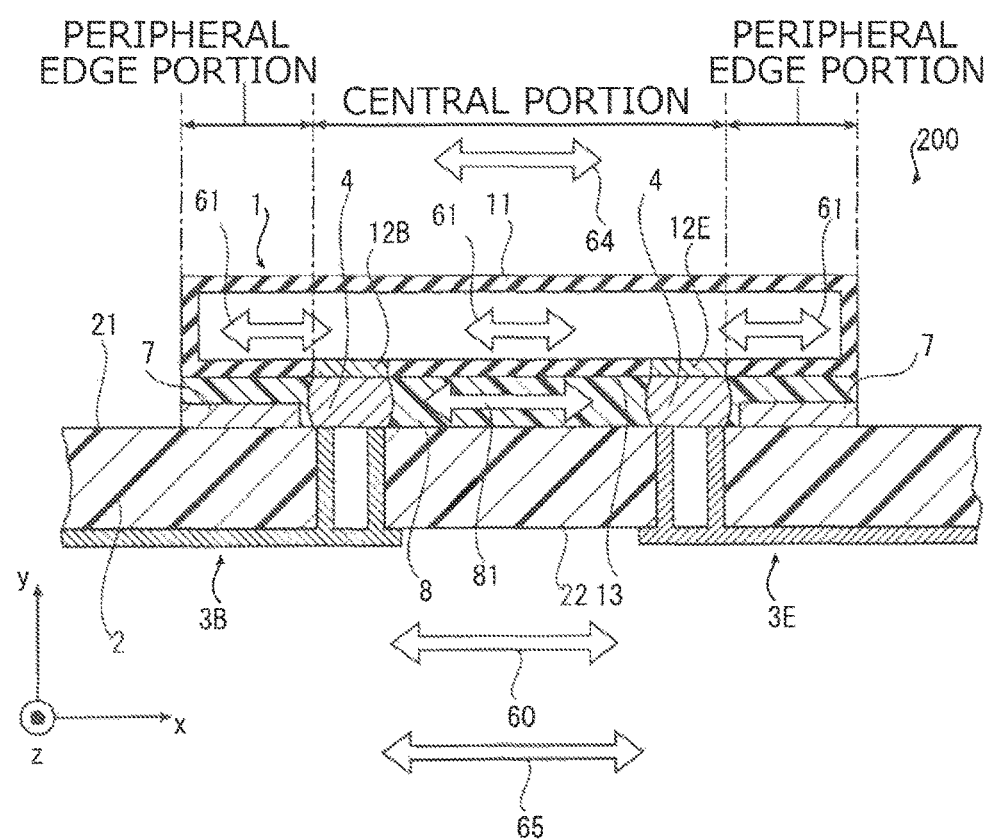
FIG. 11 is a view illustrating stresses that are applied to the semiconductor device shown in FIG. 9.

FIG. 11 is a view illustrating stresses that are applied to the semiconductor device 200. The reference characters of the through holes, the interlayer connection portions, and the pattern portions are not shown in FIG. 11.

As shown in FIG. 11, the expanding member 8 expands with heat generated by the semiconductor element 1 or heat from the heat source in the directions parallel to the xz plane. With the expansion of the expanding member 8, a stress 81 in the directions parallel to the xz plane is applied to the expanding member 8. Moreover, the stress 61 is applied to the semiconductor element 1, and the stress 60 is applied to the circuit board 2. The expanding member 8 has a larger coefficient of linear thermal expansion than the semiconductor element 1 and also has a larger coefficient of linear thermal expansion than the circuit board 2 and the metal wires 3. The stress 81 is therefore larger than the stress 60 and the stress 61.

The expanding member 8 is fixed to the terminal formation surface 13 of the semiconductor element 1 and a part of the overlapping region 21A of the upper surface 21 of the circuit board 2, namely a part where the insertion member 7 is not formed. The semiconductor element 1 and the circuit board 2 are therefore subjected to the stress 81 from the expanding member 8.

The stress 81 that is applied from the expanding member 8 to the semiconductor element 1 will be described below. Since the expanding member 8 is fixed to the terminal formation surface 13 of the semiconductor element 1, the semiconductor element 1 is subjected to the stress 81 associated with expansion of the expanding member 8 from the entire terminal formation surface 13. That is, the semiconductor element 1 receives from the expanding member 8 a force in the directions parallel to the xz plane and toward the outside of the semiconductor element 1. As a result, the central portion and the peripheral edge portion of the semiconductor element 1 are subjected to a combined stress 64 of the stress 61 and the stress 81. The combined stress 64 is larger than the stress 61 associated with expansion of the semiconductor element 1.

The stress that is applied from the expanding member 8 to the circuit board 2 will be described below. The expanding member 8 is fixed to a part of the overlapping region 21A of the upper surface 21 of the circuit board 2. The part of the overlapping region 21A is the overlapping region 21A except for a region where the insertion member 7 is formed. The circuit board 2 is therefore subjected to the stress 81 from the expanding member 8 in this part of the overlapping region 21A. Accordingly, a part of the circuit board 2 which has the expanding member 8 fixed thereto is subjected to a combined stress 65 of the stress 60 applied to the circuit board 2 and a part of the stress 81 transmitted from the expanding member 8.

The part of the overlapping region 21A is smaller than the terminal formation surface 13 of the semiconductor element 1. As described below, the insertion member 7 absorbs the stress 81 transmitted from the expanding member 8 to the circuit board 2. The stress 81 transmitted from the expanding member 8 to the circuit board 2 is therefore smaller than the stress 81 transmitted from the expanding member 8 to the terminal formation surface 13 of the semiconductor element 1. Since the difference between the combined stress 64 and the combined stress 65 is smaller than the difference between the stress 60 applied to the circuit board 2 and the metal wires 3 and the stress 61 applied to the semiconductor element 1, the semiconductor device 200 can reduce a shear stress that is applied to the connection surface between the connection terminal 12 and the solder bump 4. The semiconductor device 200 can thus restrain cracks from forming in the connection surface between the connection terminal 12 and the solder bump 4.

Although the stress 41 applied to the solder bumps 4 is not shown in FIG. 11, the semiconductor device 200 can reduce a shear stress resulting from the difference in coefficient of linear thermal expansion between the semiconductor element 1 and the solder bumps 4, like the semiconductor device 100.

Since the semiconductor element 1 is subjected to the stress 81 at its entire terminal formation surface 13, the semiconductor device 200 can reduce a local difference in stress that is applied to the semiconductor element 1, like the semiconductor device 100. The semiconductor device 200 can thus restrain warping of the semiconductor element 1 and can restrain cracks from forming in the connection surface between the connection terminal 12 and the solder bump 4.

The reason why the insertion member 7 absorbs the stress 81 transmitted from the expanding member 8 to the circuit board 2 will be described. As described above, since the expanding member 8 has a larger coefficient of linear thermal expansion than the circuit board 2 and the metal wires 3, expansion of the expanding member 8 in the directions parallel to the xz plane is larger than that of the circuit board 2 and the metal wires 3 in the directions parallel to the xz plane. The insertion member 7 is fixed to the upper surface 21 of the circuit board 2.

The connecting surface between the insertion member 7 and the expanding member 8 is therefore subjected to a shear stress parallel to the xz plane. The upper surface of the insertion member 7 moves so as to be shifted in the directions parallel to the xz plane with respect to the lower surface of the insertion member 7. The insertion member 7 can thus absorb the stress 81 transmitted from the expanding member 8. Since the insertion member 7 absorbs the stress 81, the stress that is applied to the expanding member 8 is less likely to be transmitted to a part of the overlapping region 21A of the upper surface 21 of the circuit board 2 where the insertion member 7 is formed. The stress 81 transmitted from the expanding member 8 to the circuit board 2 is therefore smaller than the stress 81 transmitted from the expanding member 8 to the semiconductor element 1.

If a stress applied to the contact surface between the insertion member 7 or applied to the inside of the expanding member 8 increases, the expanding member 8 is separated from the insertion member 7 or is destroyed. The expanding member 8 separated from the insertion member 7 or destroyed moves relative to the insertion member 7. In this case, the stress 81 applied to the expanding member 8 is not transmitted to the insertion member 7. The stress 81 transmitted from the expanding member 8 to the circuit board 2 therefore continues to be smaller than the stress 81 transmitted from the expanding member 8 to the semiconductor element 1. Accordingly, even if the expanding member 8 is separated from the insertion member 7, cracks can be restrained from forming in the connection surface between the connection terminal 12 and the solder bump 4.

Figure 12:
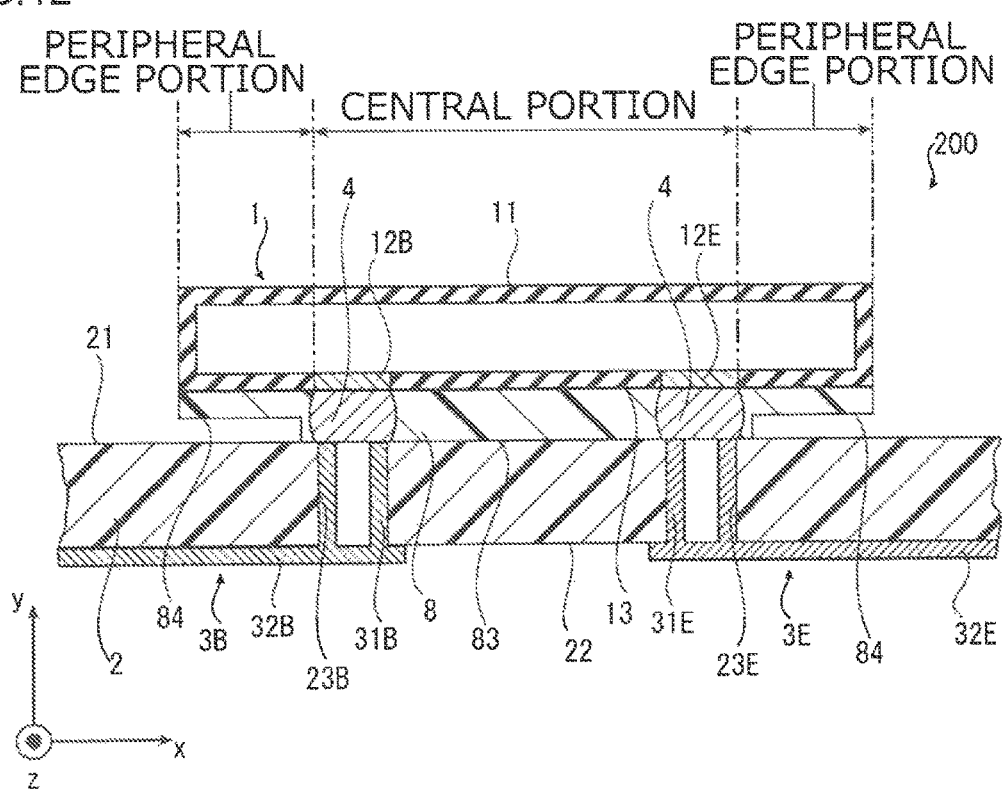
FIG. 12 is a side sectional view of a modification of the semiconductor device shown in FIG. 9.

The second embodiment is described with respect to an example in which the semiconductor device 200 includes the insertion member 7. However, the present invention is not limited to this. The semiconductor device 200 may not include the insertion member 7. In this case, as shown in FIG. 12, the expanding member 8 need only be formed so that its lower surface have a region that does not contact the upper surface 21 of circuit board 2. That is, the expanding member 8 need only be formed so that its lower surface facing the upper surface 21 of the circuit board 2 has a contact surface 83 contacting the upper surface 21 and a non-contact surface 84 not contacting the upper surface 21. This configuration can also reduce the size of a part of the overlapping region 21A of the circuit board 2 which is directly subjected to the stress 81 applied to the expanding member 8, and can thus prevent cracks from forming in the connection surface between the connection terminal 12 and the solder bump 4.

In the case where the semiconductor device 200 does not have the insertion member 7 as shown in FIG. 12, the metal wires 3A to 3F may be formed on the upper surface 21 of the circuit board 2. That is, in the case where the semiconductor device 200 has the configuration shown in FIG. 12, the metal wires 3 need only be formed on at least one of the upper surface 21 and the lower surface 22 of the circuit board 2.

The second embodiment is described with respect to an example in which the insertion member 7 has an annular shape. However, the present invention is not limited to this. The shape of the insertion member 7 and the position of the insertion member 7 are not particularly limited as long as the insertion member 7 is a member inserted between the upper surface 21 of the circuit board 2 and the non-contact surface 84 of the expanding member 8 and the expanding member 8 is fixed to the upper surface (the surface facing the terminal formation surface 13) of the insertion member 7.

The above embodiments are described with respect to an example in which the semiconductor element 1 includes the connection terminals 12A to 12F. However, the present invention is not limited to this. The semiconductor element 1 need only have at least two connection terminals that are formed in the terminal formation surface 13.

The above embodiments are described with respect to an example in which the semiconductor element 1 is a lateral semiconductor element. However, the present invention is not limited to this. The connection terminals 12 may be disposed in a surface other than the terminal formation surface 13 in the semiconductor element 1.

What is claimed is:

1. A semiconductor device, comprising:
   a circuit board having a first surface and a second surface opposite the first surface;
   at least two metal wires formed on at least one of the first and second surfaces;
   a semiconductor element having at least two connection terminals formed in a terminal formation surface disposed so as to face the first surface;
   solder electrically connecting the at least two connection terminals to the at least two metal wires; and
   an expanding member fixed to the terminal formation surface of the semiconductor element, having a larger coefficient of linear thermal expansion than the semiconductor element, and having a size larger than an interval between adjacent two of the at least two connection terminals, wherein
   the expanding member has a larger coefficient of linear thermal expansion than the metal wires, and
   a surface of the expanding member which faces the first surface has a contact surface that contacts the first surface and a non-contact surface that does not contact the first surface.

2. The semiconductor device according to claim 1, wherein
   the expanding member has a coefficient of linear thermal expansion of 10 to $33 \times 10^{-6}$ (1/K).

3. The semiconductor device according to claim 2, wherein
   the expanding member has an annular shape surrounding the at least two connection terminals formed in the terminal formation surface.

4. The semiconductor device according to claim 1, wherein
   a surface of the expanding member which faces the first surface contacts the first surface, and
   the expanding member is movable relative to the circuit board.

5. The semiconductor device according to claim 1, further comprising:
   an insertion member inserted between the first surface and the non-contact surface and having a smaller coefficient of linear thermal expansion than the expanding member.

6. The semiconductor device according to claim 1, wherein
   the expanding member is fixed to a surface facing the terminal formation surface, and
   an insertion member is disposed between the first surface and the non-contact surface.

7. A semiconductor device, comprising:
   a circuit board having a first surface and a second surface opposite the first surface;
   at least two metal wires formed on at least one of the first and second surfaces;
   a semiconductor element having at least two connection terminals formed in a terminal formation surface disposed so as to face the first surface;
   solder electrically connecting the at least two connection terminals to the at least two metal wires; and
   an expanding member fixed to the terminal formation surface of the semiconductor element, having a larger coefficient of linear thermal expansion than the semiconductor element, and having a size larger than an interval between adjacent two of the at least two connection terminals, wherein
   a surface of the expanding member which faces the first surface contacts, but is not fixed to, the first surface, and
   the expanding member is movable relative to the circuit board in a direction parallel to the first surface.

8. The semiconductor device according to claim 7, wherein
   the expanding member has a coefficient of linear thermal expansion of 10 to $33 \times 10^{-6}$ (1/K).

9. The semiconductor device according to claim 8, wherein
   the expanding member has an annular shape surrounding the at least two connection terminals formed in the terminal formation surface.

* * * * *